Figure 1:
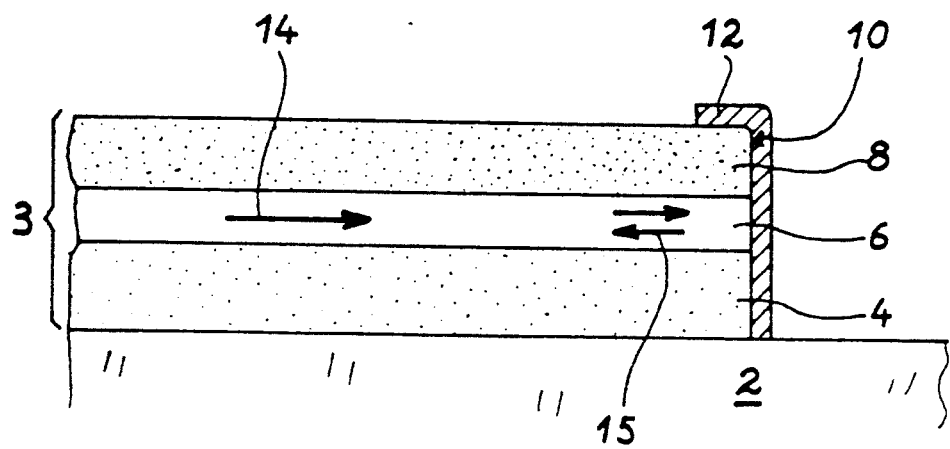

United States Patent [19]

Valette

[11] Patent Number: 5,323,407
[45] Date of Patent: Jun. 21, 1994

[54] INTEGRATED OPTICAL MIRROR AND ITS PRODUCTION PROCESS

[75] Inventor: Serge Valette, Grenoble, France

[73] Assignee: Commissariat a l'Energie Atomique, Paris, France

[21] Appl. No.: 988,460

[22] Filed: Dec. 10, 1992

[30] Foreign Application Priority Data

Dec. 16, 1991 [FR] France ................... 91 15591

[51] Int. Cl.[5] ............................... H01S 3/13
[52] U.S. Cl. .......................... 372/29; 372/92; 372/97; 372/64; 372/69; 372/6
[58] Field of Search ............ 372/99, 88, 96, 64, 372/6, 92

[56] References Cited

U.S. PATENT DOCUMENTS 4,485,474 11/1984 Osterwalder ................. 372/28

OTHER PUBLICATIONS

Japan –Patent Abstracts of Japan, vol. 10 No. 327 Nov. 7, 1986, & JP-A-61 132,908.
Japan-Patent Abstracts of Japan, vol. 10, No. 108 Apr. 23, 1986 & JP-A-60 246 688.

Primary Examiner—Léon Scott, Jr.
Attorney, Agent, or Firm—Michael N. Meller

[57] ABSTRACT

The optical mirror incorporates a lightguide (20) produced on a surface (23) of a substrate (22) and used for the propagation of a light beam (36) in a direction parallel to said surface, a cavity (30) made in the lightguide (20) and having in the propagation direction a first (32) and a second (34) walls oriented perpendicular to said direction and having in section approximately the shape of a circular arc, the distance (L) separating the two walls being equal to the radius of curvature (R) of the second wall at the optical axis (37) of the mirror and a reflecting material layer (38) deposited solely on the second wall in order to reflect the light beam towards the first wall, the second wall forming a concave reflecting surface.

16 Claims, 5 Drawing Sheets

FIG. 7a
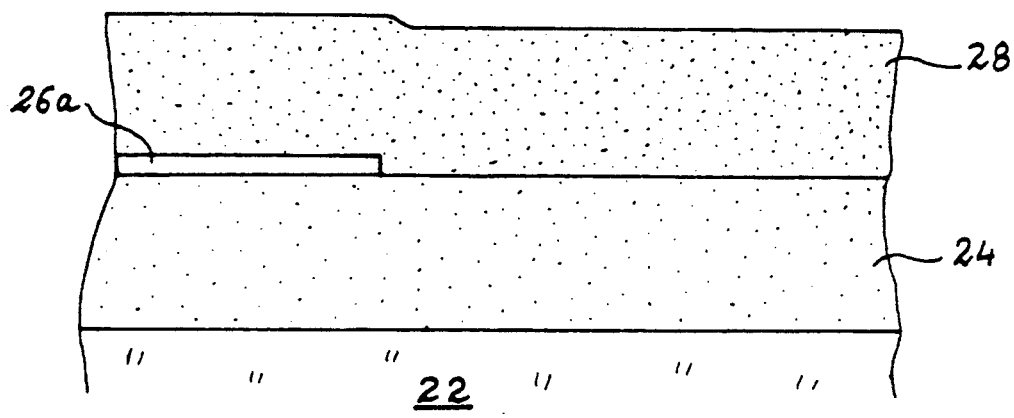
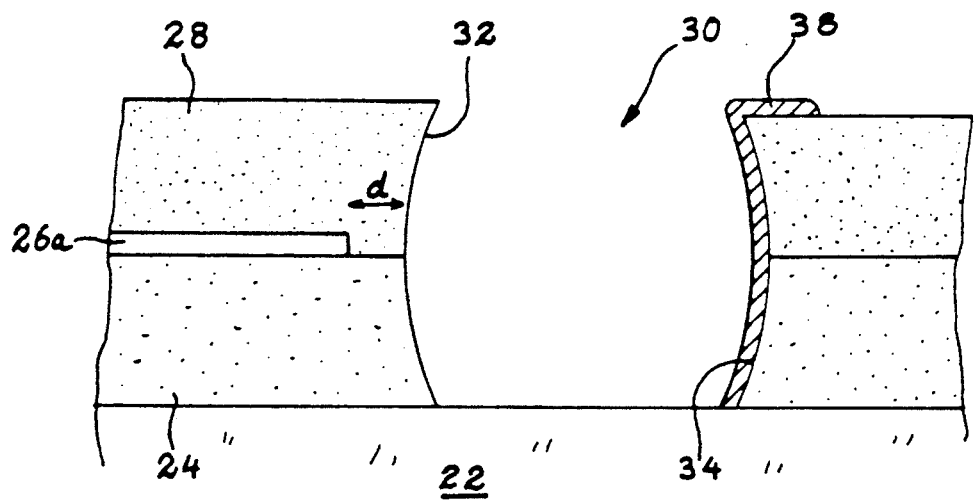
FIG. 7b

INTEGRATED OPTICAL MIRROR AND ITS PRODUCTION PROCESS

DESCRIPTION

The present invention relates to a mirror for integrated optics, as well to its production process. It is used in all fields where it is wished to reflect a light beam and in particular in the field of real time radar signal processing, e.g. in correlators, spectrum analyzers or interferometers, in the field of optical communications and in the field of optical fibre sensors and transducers. The latter are in particular used in the space, naval, automobile and aeronautical fields, as well as on production lines for a large number of objects. More specifically, said mirror is intended to equip an external cavity for the stabilization of a semiconductor laser diode.

Information processing and/or remote transmitting methods investigated over the last few years utilize transmission by light wave in planar lightguides. These lightguides are constituted by a guiding layer intercalated between two upper and lower confinement layers stacked on a substrate, the guiding layer having a real refractive index higher than that of the upper and lower layers. In certain cases, the upper layer can be replaced by air.

Integrated optical mirrors constitute one of the basic components of all planar guide structure integrated optical circuits.

At present, the easiest way to produce a mirror in integrated optics is shown in longitudinal section in the attached FIG. 1. It is possible to see therein a substrate 2 supporting a lightguide 3 constituted by the lower confinement layer 4 or buffer layer, then the guide layer 6 and finally the upper confinement layer 8.

The construction of the mirror consists of entirely etching the layers 4, 6 and 8 of the guide up to the substrate and covering the etched flank 10 by a metallizing coating 12, in order to reflect the incident beam 14 transmitted by the layer 6 to the guide layer 6 again. The reflected beam carries the reference 15. The metallizing coating 12 can be replaced by a stack of dielectric coatings serving as a mirror.

This type of mirror is in particular used for guide structures formed on silicon substrates, e.g. of type $Si/SiO_2/Si_3N_4/SiO_2$, called $OIS_1$, or of type $Si/SiO_2/$doped $SiO_2/SiO_2$, called $OIS_2$. The doping of the guide layer is such that its refractive index is higher than that of the upper and lower confinement layers.

The difficulties in producing such a mirror are essentially linked with the etching of the actual guide structure for the two following reasons:
- the etching thickness of the guide structure can be significant, e.g. 25 to 30 µm, for an $OIS_2$ structure used for optical communication;
- the quality of the etching from the surface state standpoint and in particular the profile of the flank 10 plays an essential part with regards to the value of the reflection coefficient of the mirror.

Everything would be perfect, if the etching of the guide structure was perfectly perpendicular to the plane of the guide layers. Unfortunately this situation does not exist and the true profiles of the mirrors differ to a varying extent compared with the ideal profile leading to a rapid drop in the reflection coefficient. The latter increases as the incidence of the light beam 14 carried by the guide layer approaches the perpendicular to the mirror (or etched flank 10). In $OIS_2$-type structures, the light loss on reflection in the optimum cases reaches close to 3 dB (i.e. 50%) compared with the ideal value. An obvious solution would be to use technical processes leading to etching of the guide structure close to the ideal profile sought for mirrors. Although advances are to be hoped for in this field, this will lead to long, tedious and therefore expensive research, which will hardly ever lead to the absolutely ideal solution.

The present invention is directed at an integrated optical mirror and its production process making it possible to obviate these disadvantages. In particular, it makes it possible to produce mirrors having reflection coefficients equal to the theoretical coefficient, whilst still using conventional mirror production methods.

The principle of the invention is to carry out the reflection of the instant beam on the second and not the first etched flank of the guide structure encountered by the incident beam, whilst using conventionally obtained etching profiles. In section, these etching flanks are shaped like a circular arc, whose centre is roughly located on the optical axis of the mirror.

More specifically, the invention relates to an integrated optical mirror having a lightguide produced on a surface of a substrate and used for the propagation of a light beam in a direction parallel to said surface, a cavity made in the lightguide having in the propagation direction a first and a second walls oriented perpendicular to said direction and in section approximately having the shape of a circular arc, the distance separating the two walls being equal to the radius of curvature of the second wall at the optical axis of the mirror, and a reflecting material layer deposited solely on the second wall in order to reflect said light beam to the first wall, the second wall forming a concave reflecting surface.

Unlike in the case of the prior art integrated grated mirrors, the first wall encountered by the incident beam is not covered with a reflecting layer and consequently does not reflect the incident beam.

In order to improve the efficiency of the mirror and in particular reduce the divergence angle of the light guided in the cavity, the latter can advantageously be filled with a dielectric material, which also provides a mechanical protection for the mirror.

The integrated mirror according to the invention can be a parabolic, elliptical or "plane" mirror. In the two former cases, the cross-section in the plane of the guide of the second wall is respectively parabolic or elliptical and the first wall is such that the distance separating it from the second wall is constant.

The mirror according to the invention can also be an optionally parabolic or elliptical Fresnel-type mirror. In this case, the second wall is constituted by several adjacent facets ensuring both the reflection of the light beam and its dispersion and the first wall follows the profile of the second wall in such a way that the distance separating it from the second wall is constant or quasi-constant.

In practice, the distance separating the two walls is 10 to 100 µm. The precision on this distance is approximately 10%, which causes little problem and enables the mirrors according to the invention to function correctly for all radii involved, no matter whether their incidence on the second wall is perpendicular or not to the latter, unlike in the case of the prior art.

In known manner, the lightguide comprises a lower confinement layer, a guide layer and an upper confinement layer, the guide layer being interposed between the confinement layers having a refractive index higher than that of the confinement layers.

According to the invention, the cavity extends from the upper layer to the lower layer of the guide structure, so that the light rays can freely diverge in the cavity and reach the second wall without any obstacle.

The mirror according to the invention can be produced on a large number of substrates and in particular on glass, lithium niobate, silicon, III-V materials and e.g. on GaAs or InP, or on II-VI materials, e.g. CdTe.

In particular, the mirror according to the invention is applicable to the following structures:
glass/glass doped by ion exchange/$SiO_2$
$Si/SiO_2/Si_3N_4/SiO_2$
$Si/SiO_2/Al_2O_3/SiO_2$
$Si/SiO_2/SiO_xN_y/SiO_2$ with $o<x<2$ and $O<y<4/3$,
$Si/SiO_2$/doped $SiO_2/SiO_2$.

The dopants of the silica guide layer are such that the latter has a refractive index higher than that of the adjacent layers.

In addition, the silica of the confinement layers can be used in pure or doped form. When the latter is doped by a dopant reducing its refractive index, the guide layer can optionally be produced from undoped silica.

The doping of the silica by a material increasing its refractive index can be carried out by phosphorus, germanium, titanium or nitrogen and the doping of the silica by a dopant reducing its refractive index can be carried out by boron or fluorine. Obviously, the guide layer must still have a refractive index higher than that of the confinement layers. It is also possible to replace the silicon substrate by a silica substrate.

In a structure of the $OIS_1$ or $OIS_2$ type, the dielectric material used optionally for the filling of the cavity has a refractive index close to that of the pure or doped silica or, in the case of a guide having a large index difference, close to the effective index of the guided mode.

The invention also relates to a process for the production of an integrated optical mirror of the type described hereinbefore. This process consists of forming the lightguide on the face of the substrate, producing a photosensitive resin mask on the lightguide, having an opening facing the location of the cavity to be produced, eliminating the unmasked area of the lightguide, eliminating the resin mask and depositing on the second wall a reflecting material layer using a precursor ion beam of said material inclined with respect to the surface of the guide.

For $OIS_1$ and $OIS_2$ structures, the circular arc walls of the trench are obtained naturally by using reactive ionic etching using as the etching gas a fluorine-containing gas such as in particular $CF_4$, $CHF_3$, $C_2F_4$ or $SF_6$, preference being given to $CHF_3$.

The invention also relates to a semiconductor laser diode stabilized by an external cavity formed in a lightguide for the propagation of a light beam emitted by the diode in a given direction, said cavity having in the direction of the propagation a first and a second walls oriented perpendicular to said direction and, in section, approximately having the shape of a circular arc, the distance separating the two walls being equal to the radius of curvature of the second wall at the optical axis of the external cavity, and a layer of a reflecting material deposited solely on the second Wall in order to reflect said light beam to the first wall, the second wall forming a concave reflecting surface, the first wall of the cavity constituting an input face of the diode.

The invention is described in greater detail hereinafter relative to non-limitative embodiments and with reference to the attached drawings, wherein show:

FIG. 1 Already described, diagrammatically and in longitudinal section a prior art integrated optical mirror.

Figure 2:
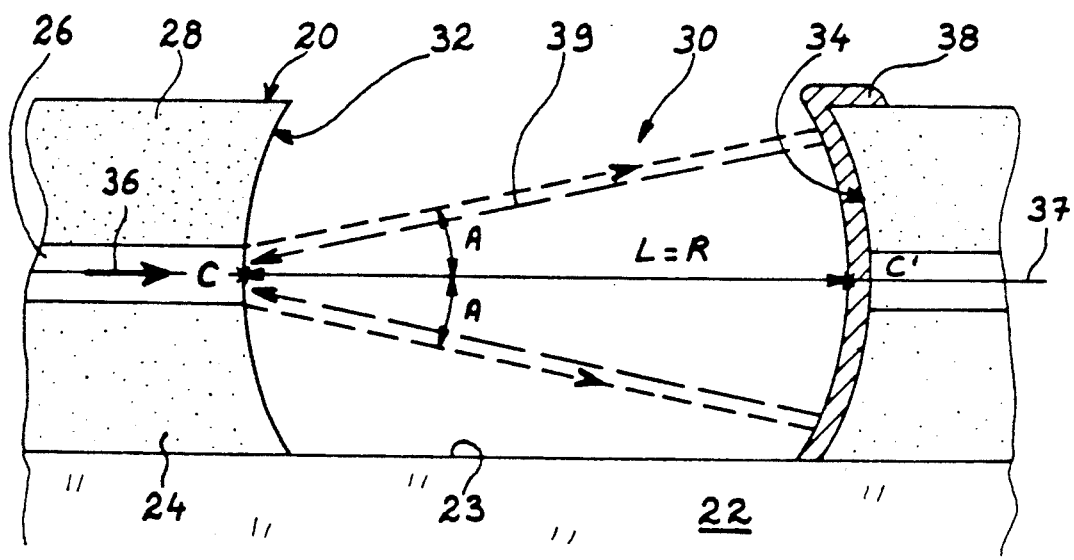

FIG. 2 Diagrammatically and in longitudinal section a "plane" integrated optical mirror according to the invention.

Figure 3:
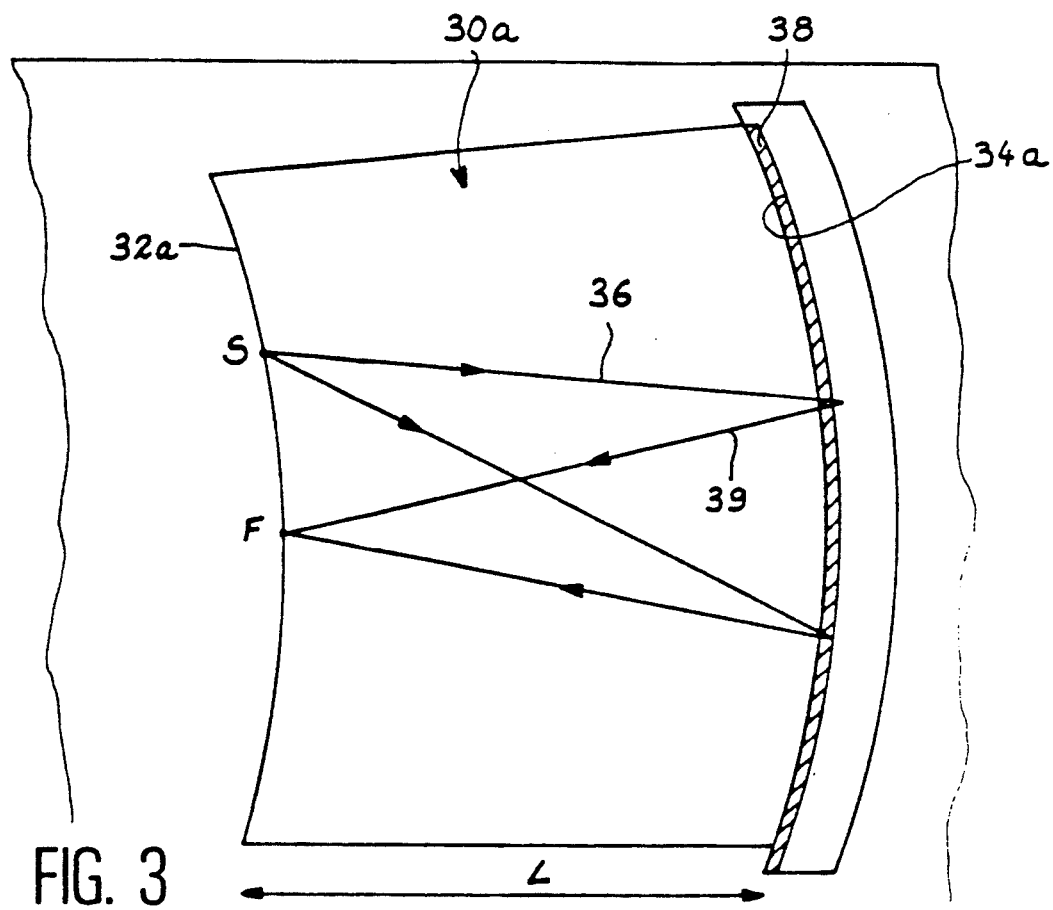

FIG. 3 Diagrammatically and in plan view an integrated elliptical or parabolic mirror according to the invention.

Figure 4:
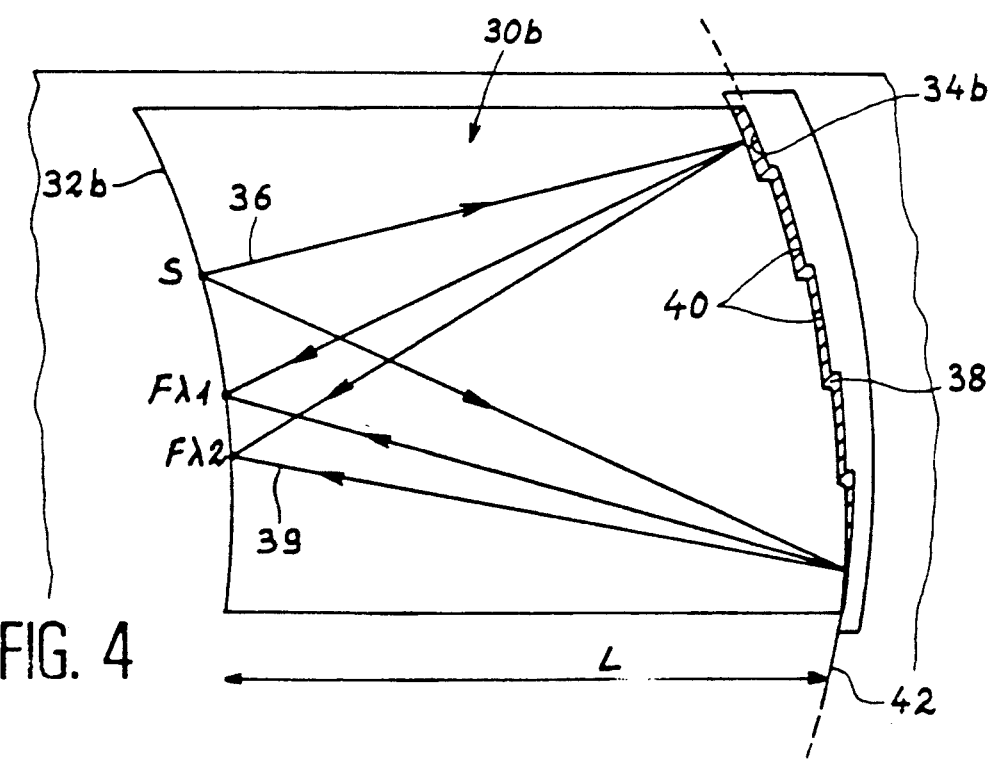

FIG. 4 Diagrammatically and in plan view a Fresnel-type integrated optical mirror according to the invention.

Figure 5A:
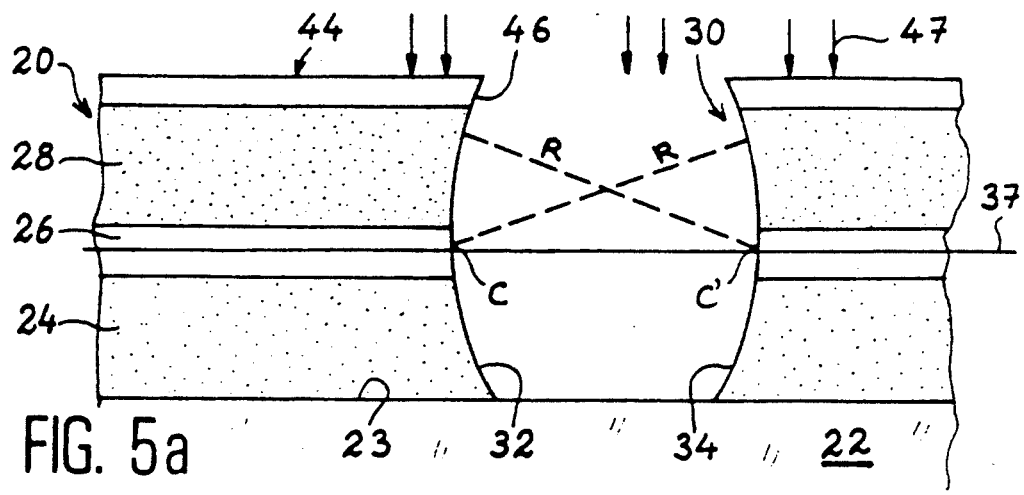
Figure 5B:
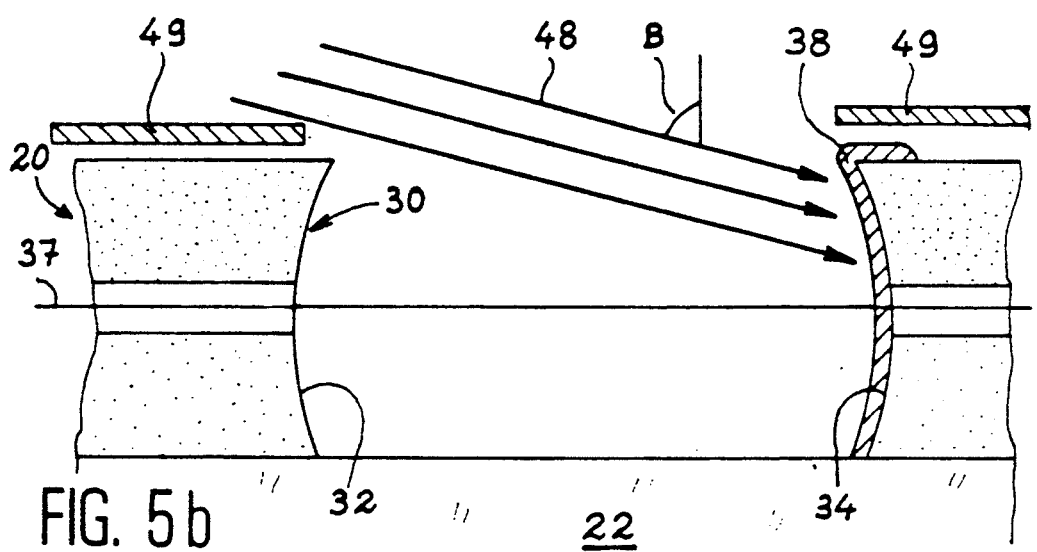

FIGS. 5a and 5b Diagrammatically the different stages of the production of an integrated mirror according to the invention in a first variant.

Figure 6:
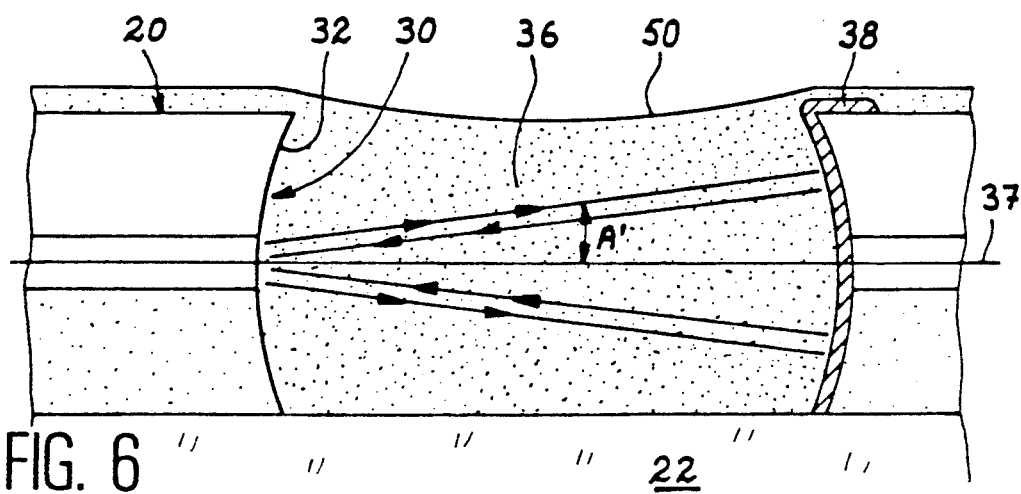

FIG. 6 Diagrammatically and in longitudinal section, a constructional variant of an integrated mirror according to the invention.

FIGS. 7a and 7b Diagrammatically the different stages of the production of an integrated mirror according to the invention, in a second variant.

Figure 8:
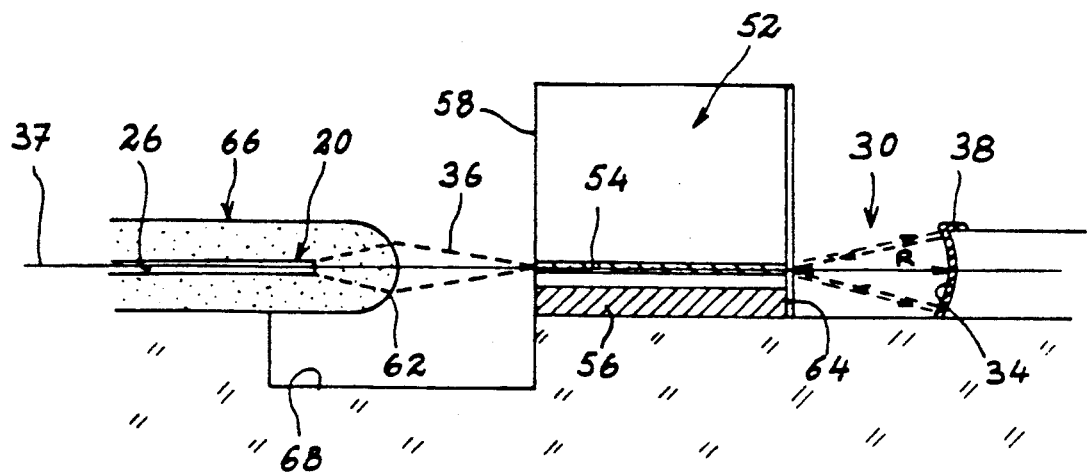
Figure 9:
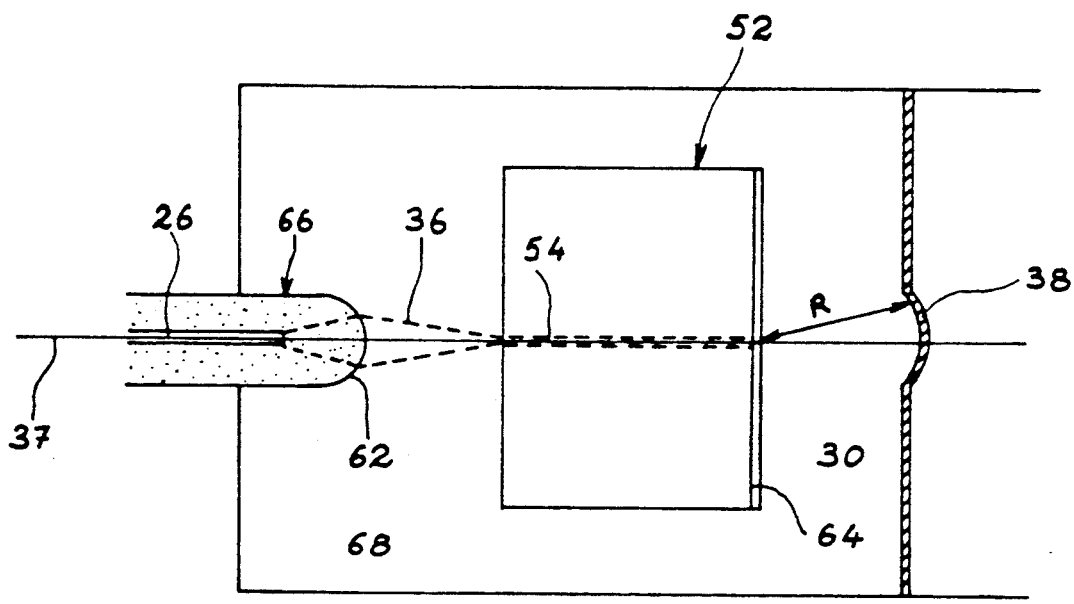

FIGS. 8 and 9 Diagrammatically, respectively in longitudinal section and in plan view, a laser diode stabilized by an external cavity and constituted by a mirror according to the invention.

FIG. 2 diagrammatically shows an integrated "plane" mirror according to the invention in the form of a sectional view in a plane perpendicular to the light propagation plane in the guide structure.

As for the prior art, the optical mirror according to the invention is formed in a guide structure 20 resting on the upper surface 23 of a substrate 22, e.g. of silicon or silica.

The guide structure 20 is constituted by three superimposed layers, namely a lower confinement layer 24 of pure or doped silica, a guide layer 26 of alumina, silicon nitride, silicon oxynitride or silica (pure or doped) having a high refractive index and an upper confinement layer 28 of pure or doped silica.

The silica of these layers can be doped either by a dopant reducing its refractive index (boron or fluorine) or by a dopant increasing its refractive index (germanium, nitrogen, phosphorus, titanium). The doping of the silica must be such that the guide layer 26 has a refractive index higher than that of the layers 24 and 28.

For an $OIS_1$ structure, the layers 24, 26 and 28 respectively have thicknesses of 1 to 8 $\mu$m, 10 to 250 nm and 1 to 8 $\mu$m. For an $OIS_2$ structure, the layers 24, 26 and 28 respectively have thicknesses of 6 to 15 $\mu$m, 1 to 10 $\mu$m and 2 to 12 $\mu$m.

According to the invention, the guide structure 20 has a cavity 30 defined by etching the stack of layers 24, 26, 28. This cavity 30 has an input wall 32 (or first wall) and an output wall 34 (or second wall) oriented perpendicular to the incident beam 36 carried by the guide layer in a direction parallel to the substrate surface 23, parallel to the plane of the guide. In the plane of FIG. 2, the walls 32 and 34 have the approximate shape of a circular arc, whose centres, respectively C and C', are roughly located on the optical axis 37 of the mirror.

According to the invention, the distance separating the walls 32, 34 of the cavity 30 and designated L is equal to the radius of curvature R of the wall 34. In practice, the distance L is approximately 10 to 100 μm. Its accuracy is approximately 10%, which does not cause any problem and enables the mirror according to the invention to operate for all light rays involved.

The precise shape of the walls is dependent on the cavity etching conditions and can therefore, to a certain extent, be adapted to take account of special features of the different wave guides (particularly the numerical aperture).

The second wall 34 defines a concave mirror for the incident beam 36 and is used for reflecting the incident light to the wall 32. The reflected beam carries the reference 39.

According to the invention, a layer 38 of a reflecting material, e.g. metal is deposited solely on the cavity wall 34. This layer 38 is in particular of aluminium, gold, silver, etc. and has a thickness of typically 50 to 1000 nm.

The input wall 32 of the cavity 30 also has, in section, the shape of a circular arc.

In the embodiment shown in FIG. 2, the wall 32 generally has a concavity reverse of that of the wall 38. It ensures a divergence of the incident beam 36 by an angle A with respect to the optical axis 37 of the mirror.

FIG. 3 diagrammatically shows a parabolic or elliptical mirror according to the invention. FIG. 3 is a plan view of said mirror and is therefore in the plane of the guide. In this type of mirror, for a light source point S in the guide layer 26, the focussing point F is displaced in the plane of the guide parallel to the substrate surface 23. The source point S can be supplied either by an integrated diopter (integrated lens of the Fresnel type or the like) or by the end of a light microguide. The focussing point F can also correspond to the end of a microguide. In general, S and F are located on the first wall 32A.

As hereinbefore, only the second wall 34a of the cavity 30a encountered by the incident beam 36 is covered with a reflecting layer 38. According to the invention, only said reflecting face 34a strictly needs to be parabolic or elliptical depending on whether the said mirror is a parabolic or elliptical mirror. The input wall 32a of the cavity 30a, which is only used for diffracting the incident light 36, follows the profile of the wall 34a in such a way that the distance L separating the surface 32a from the surface 34a remains constant from the bottom of the cavity to its surface. Thus, the wall 32a has a concavity identical to that of the wall 34a and therefore has an elliptical or parabolic shape.

FIG. 4 diagrammatically shows in plan view a dispersive, Fresnel-type integrated mirror according to the invention. This mirror has a cavity 30b, whereof the second wall 34b has the general shape of a circular arc in a plane perpendicular to the propagation plane (i.e. in a plane perpendicular to that of FIG. 4). Moreover, said wall 34b is constituted by multiple facets 40, which ensure both the reflection of the incident light 36 and its dispersion as a function of the wavelength.

Thus, said mirror for a light source point S' with multiple wavelengths in the guide layer and in particular wavelengths $\lambda_1$ and $\lambda_2$, has focussing points of the wall 34b of the cavity 30b and therefore the mirror displaced in the plane of the guide by $F\lambda_1$ and $F\lambda_2$. As hereinbefore, the points S', $F\lambda_1$ and $F\lambda_2$ can correspond to ends of light microguides produced in a prior operation, the orientation of the microguides in which the light is refocussed is chosen so as to favour the light coupling (generally in the direction of the median ray).

The mirror of FIG. 4 is in particular an elliptical mirror.

As for the mirror shown in FIG. 3, the second wall 34b of the cavity 30b is covered with a reflecting layer 38. Moreover, the first wall 32b encountered by the incident beam 36 follows the profile of the wall 34b at a distance L equal to the mean radius of curvature of the wall 34b.

Bearing in mind the small displacements of the facets 40, typically 1 μm, it is not necessary to reproduce these facets on the wall 32b. Therefore the latter can follow the envelope 42 of the wall 34b.

In addition, as in the embodiment of FIG. 3, the two walls 32b and 34b have a concave shape.

The following description relates to the production of an optical mirror according to the invention. The description relates to a "plane" optical mirror like that shown in FIG. 2. However, it is obvious that this process also applies to the production of other types of mirror.

With reference to FIG. 5a, the first stage of the process consists of forming the lightguide 20 on the surface 23 of the Substrate 22 by successively depositing the layers 24, 26 and 28 by thermal oxidation of the substrate for the layer 24 and by optionally plasma-assisted chemical vapour deposition for layers 26 and 28. The layer deposition methods are in accordance with the prior art.

Using conventional photolithography processes, this is followed by the production of a resin mask 44 having an opening 46 at the location where it is wished to produce the mirror cavity 30. This mask 44 is e.g. produced according to the known three-layer procedure (successive depositions of a lower resin layer, a dielectric layer and an upper resin layer, producing a mask in the upper resin layer, etching the dielectric layer, elimination of the upper resin layer and then using said dielectric mask for etching the lower resin layer and finally eliminating the dielectric mask).

This is followed by a high power reactive ionic etching (250 to 400 W) of the three layers 28, 26 and 24 of the guide using a fluorine-containing agent 47 and in particular $CHF_3$ at high pressure (>90 mT, i.e. >12 Pa in the machine used). This gives a cavity 30 facing the opening 46 of the resin mask 44, whose walls 32 and 34 have, in section, the shape of a circular arc of radius R and whose respective centres C and C' are located on the optical axis 37. The cavity is barrel-shaped with a width maximum on the optical axis 37.

The reactive ionic etching of the silica based on fluorine-containing compounds makes it possible to produce various etched shapes, which are a function of the pressure of the gases used ($CHF_3+O_2$ or others), the power used, the oxygen level and the resistance of the mask to the etching agent.

In general terms, under high power and high pressure, the number of collisions between the etching agent and the material to be etched increases and tends to decrease the anisotropy of the etching. This would consequently lead to a non-vertical etching with a maximum opening on the bottom, but in practice the mask, if it is able to resist the etching well (good selectivity), will oppose the obtaining of this shape, which is the case with a three-layer mask (thick resin/$SiO_2$/thin resin).

Unlike in the invention, with silica thicknesses smaller than those used here and in particular with $OIS_1$ structure, it is possible to work at a lower power and lower pressure and thus obtain more vertical profiles.

Following the elimination of the resin mask 44, e.g. with the aid of an adapted solvent or an oxygen plasma, in the manner shown in FIG. 5b, the metal layer 38 is deposited on the wall 34 of the cavity 30. This deposit is brought about by supplying an ion beam 48, e.g. through a metal mask 49, inclined by an angle B relative to the surface of the guide 20. Typically B is 20° to 80° for L of 10 to 100 μm. This ion beam 48 can result from a vacuum evaporation or a cathodic sputtering.

As a result of the inclination, the wall 32 is not generally touched or affected by the metallization and the excess metal can then be removed by etching. In this case, the metallization of the wall can take place without a mask 49.

It is also possible to use the lift off procedure (deposition of a resin mask, metallization, elimination of the resin and the metal covering it) for forming the deposit 38.

It is also possible to replace the metal deposit by a dielectric multilayer deposit, using the same principle.

FIG. 6 shows diagrammatically and in section a constructional variant of the mirror according to the invention. In this variant, the mirror differs from those described hereinbefore by the filling of the cavity 30 with a dielectric material 50 having a refractive index preferably close to that of the guide layers 24, 26 and 28 and therefore, in the present case, pure silica or doped silica, or in the case of significant refractive index differences, close to the effective index of the guided mode (case of $OIS_1$ guides). In particular, said dielectric 50 can be silica gel or an optical adhesive or glue.

This dielectric 50 provides a mechanical protection for the mirror. It also improves the efficiency of the mirror by reducing the divergence angle A' of the light guided in the cavity 30. It also reduces light losses by Fresnel-type reflection on the first wall 32 of the cavity.

The cavity 30 can be filled either by chemical vapour deposition, or with a syringe following the previously etched filling circuits, or by using a whirler.

In the case of guide structures constituted by very different materials, such as $Si/SiO_2/Si_3N_4/SiO_2$ or $Si/SiO_2/Al_2O_3/SiO_2$ structures, the etching of the core material ($Si_3N_4$ or $Al_2O_3$) can be different from that of the surrounding materials ($SiO_2$).

In this case, the mirror is advantageously produced in the manner shown in Figs. 7a and 7b:

1) deposition of the lower 24 and guide 26 layers of the guide structure;
2) etching the guide layer in the form of a planar guide or microguide 26a (FIG. 7a) in such a way as to only retain core material upstream of the first wall 32 of the cavity 30 to be produced;
3) deposition of the upper confinement layer 28 on the structure obtained in 2) (FIG. 7a);
4) production of the cavity 30 by etching the lower and upper confinement layers 24, 28, followed by the deposition of the metal layer 38 (FIG. 7b).

The distance d between the end of the core of the guide 26a and the first wall 32 of the mirror is small (a few micrometres).

This process has the advantage of only requiring the deep etching of a single material type (in this case silica), whilst avoiding possible etching and therefore profile disengagements of the wall 34 due to etching speed differences of the materials in dry etching.

The previously described mirror and its production process can advantageously be used for stabilizing a semiconductor laser diode with the aid of an external cavity.

The advantages of a stability by external cavity are an operation of the diode on a single longitudinal mode and a frequency stability due to the lack of mode jumping.

FIGS. 8 and 9 respectively show, in longitudinal section and plan view, a laser diode stabilized by an external cavity equipped with a mirror according to the invention, such as is described relative to FIG. 2.

The diode 52 provided with a planar or confined active zone 54 is hybridized and fixed to the substrate 22 by a metal weld 56. This diode is in particular produced from III-V material using known methods. It has an output face 58 and an input face 60, obtained by cleaving, respectively facing a focussing lens 62 for focussing the light 36 emitted by the diode into the optical guide 20, and an external cavity constituted by the cavity 30 of the mirror according to the invention. The optical axis 37 of the mirror and therefore of the external cavity passes through the active zone 54.

The input face 60 of the diode has an antireflecting coating 64 serving as a semitransparent mirror and constitutes the first mirror wall. The metal layer 38 formed on the second wall 34 of the mirror according to the invention makes it possible to reflect the light passing out of the semitransparent mirror 64 towards the active zone 54.

The focussing lens 62 is formed at the end of a tongue 66 defined in the optical guide 20 and overhanging a recess 68 made in the substrate 22. The tongue is obtained by carrying out two successive etching processes, the first being performed at the same time as the etching of the cavity 30 and is used for freeing the optical guide, whilst the second is used for freeing the tongue 66 from the substrate and for forming the recess 68. The second etching is a microwave etching using reactive gases such as Ar, $SF_6$ and $O_2$.

The lens 62 is obtained by melting the end of the tongue 66 by laser illumination at a wavelength absorbed by the silica, such as the emission of a $CO_2$ laser.

The distance L separating the diode input face and the metal layer 38 is in this case typically 30 to 300 μm and is equal to the radius of curvature R of the mirror. This makes it possible to reinject a maximum of light into the diode and to make oscillate on the external cavity. In plan view, the reflecting face 38 of the mirror according to the invention also has a spherical shape with the same radius of curvature R.

I claim:

1. Integrated optical mirror comprising a lightguide produced on a surface of a substrate and used for the propagation of a light beam in a direction defined by an optical axis oriented parallel to said surface, and a cavity in said lightguide with said cavity having a first and second wall spaced apart from one another and oriented perpendicular to the direction of light propagation having a cross-sectional shape approximating a circular arc with said second wall having a concave reflecting surface and a radius of curvature (R), with the distance separating the first and second walls being equal to said radius of curvature (R) and with said second wall having a layer of reflecting material covering said concave surface to reflect said light beam to the first wall.

2. Integrated mirror according to claim 1, characterized in that the cross-section in the plane of the guide of the second wall is parabolic and that the distance separating said first wall from the second wall is constant.

3. Integrated mirror according to claim 1 of the Fresnel type, characterized in that the second wall has a profile containing a plurality of adjacent facets for ensuring both the reflection of the light beam and its dispersion and in that the profile of said first wall follows the profile of the second wall such that the distance separating the second wall from the first wall is constant.

4. Integrated mirror according to claim 1 characterized in the cross-section in the plane of the guide of the second wall is elliptical and that the distance separating said first wall from the second wall is constant.

5. Integrated mirror according to claim 1 of the Fresnel type, characterized in that the second wall has a profile containing a plurality of adjacent facets for ensuring both the reflection of the light beam and its dispersion and in that the profile of said first wall follows the profile of the second wall such that the distance separating the second wall from the first wall is quasi-constant.

6. Integrated mirror according to claim 1, characterized in that the distance separating the two walls is 10 to 100 μm within an accuracy of approximately 10%.

7. Integrated mirror according to claim 1, characterized in that the cavity is filled with a dielectric material for providing mechanical protection for the mirror.

8. Integrated mirror according to claim 1, characterized in that the lightguide comprises a lower confinement layer, a guide layer and an upper confinement layer with the guide layer interposed between the confinement layers and having a refractive index higher than that of the lower and upper confinement layers and in that the cavity extends from the upper layer to the lower layer.

9. Integrated mirror according to claim 8, characterized in that the substrate is composed of a material selected from the group consisting of silicon and silica, and wherein the upper and lower layer is composed of a material selected from the group consisting of pure silica layers and doped silica layers and with the guide layer composed of a material selected from the group consisting of silica, alumina, silicon nitride and silicon oxynitride.

10. Integrated mirror according to claim 9, characterized in that the cavity is filled with a material having a refractive index substantially equal to the refractive index of pure silica, doped silica or the an effective index of the guided moded.

11. Integrated mirror according to claim 8, characterized in that the guide layer is etched in such a way that it only remains upstream of the first wall.

12. Process for producing an integrated optical mirror having a lightguide produced on a surface of a substrate and used for propagating a light beam in a direction parallel to said surface, a cavity formed in the lightguide with the cavity having in the light propagation direction a first and second wall spaced apart and oriented perpendicular to the direction of light propagation and having a cross-sectional shape approximating a circular arc with the second wall having a concave reflecting surface and a radius of curvature (R) and with the distance separating the two walls being equal to the radius of curvature (R) of the second wall characterized in that the lightguide is formed on the surface of the substrate (22) by the process of producing a photosensitive resin mask on the lightguide, having an opening facing a zone of the lightguide in the location of the cavity to be produced, eliminating said zone of the lightguide which is not masked, eliminating the resin mask and depositing on the second wall a reflecting material layer using a precursor ion beam of said material, inclined with respect to the surface of the guide.

13. Process according to claim 12, characterized in that the substrate is composed of a material selected from the group consisting of silicon and silica and further characterized in that the lightguide has a lower confinement layer composed of a material selected from the group consisting of pure silica layers and doped silica layers and a guide layer composed of a material selected from the group consisting of doped silica, alumina, silicon nitride or silicon oxynitride and an upper confinement layer composed of a material selected from the group consisting of pure silica and doped silica and having a guide layer interposed between the confinement layers with a refractive index higher than that of the lower and upper layers.

14. Process according to claim 12, characterized in that etching is carried out with a fluorine-containing gas.

15. Process according to claim 12, characterized in that the guide is formed by a) depositing a lower confinement layer on a substrate, b) depositing a guide layer on the lower confinement layer, c) etching the guide so as to only retain the material of the guide layer upstream of the first wall of the cavity to be formed and d) depositing an upper confinement layer on the structure obtained in c).

16. Semiconductor laser diode stabilized by an external cavity formed in a lightguide for propagating a light beam emitted by the diode in a given direction, said cavity having in the direction of the propagation a first and second wall spaced apart and oriented perpendicular to said direction and, having a cross-sectional shape approximating a circular arc with the second wall having a concave reflecting surface and a radius of curvature (R) and with the distance separating the two walls being equal to the radius of curvature (R) of the second wall and with said second wall having a layer of reflecting material covering said concave surface to reflect said light beam to the first wall and with the first wall of the cavity constituting an input face of the diode for reinjecting reflected light from said reflecting material on said second wall back into said diode to thereby stabilize said laser diode.

* * * * *